United States Patent
Akahoshi

(10) Patent No.: US 9,179,539 B2
(45) Date of Patent: Nov. 3, 2015

(54) WIRING BOARD AND DESIGN METHOD FOR WIRING BOARD

(71) Applicant: FUJITSU LIMITED, Kawasaki-shi, Kanagawa (JP)

(72) Inventor: Tomoyuki Akahoshi, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/076,505

(22) Filed: Nov. 11, 2013

(65) Prior Publication Data

US 2014/0202752 A1  Jul. 24, 2014

(30) Foreign Application Priority Data

Jan. 22, 2013  (JP) .................................. 2013-009120

(51) Int. Cl.
| | |
|---|---|
| *H05K 1/11* | (2006.01) |
| *H05K 1/02* | (2006.01) |
| *H01L 23/498* | (2006.01) |
| *H01L 23/50* | (2006.01) |
| *H01L 21/48* | (2006.01) |

(52) U.S. Cl.
CPC ............ *H05K 1/0248* (2013.01); *H01L 21/486* (2013.01); *H01L 23/49822* (2013.01); *H01L 23/49827* (2013.01); *H01L 23/49838* (2013.01); *H01L 23/50* (2013.01); *H05K 1/113* (2013.01); *H01L 2224/16238* (2013.01); *H05K 2201/094* (2013.01); *H05K 2201/09263* (2013.01)

(58) Field of Classification Search
USPC ............................ 174/262; 361/760, 720, 736
See application file for complete search history.

(56) References Cited

U.S. PATENT DOCUMENTS

| | | | |
|---|---|---|---|
| 6,731,511 B2 * | 5/2004 | Yuzawa ........................ 361/760 |
| 2006/0231287 A1 | 10/2006 | Nakayama | |
| 2008/0164622 A1 | 7/2008 | Hayashi | |
| 2009/0039999 A1 | 2/2009 | Fujii et al. | |

FOREIGN PATENT DOCUMENTS

| | | |
|---|---|---|
| JP | 2003-152290 A1 | 5/2003 |
| JP | 2004-31531 A1 | 1/2004 |
| JP | 2006-278847 A1 | 10/2006 |
| JP | 2007-281004 A1 | 10/2007 |
| JP | 2008-171950 A1 | 7/2008 |
| TW | 200915358 A | 4/2009 |
| TW | 201218899 A | 5/2012 |

OTHER PUBLICATIONS

Office Action of Taiwanese Patent Application No. 102141918 dated May 18, 2015 with English Summary of TWOA based on cited reference.

* cited by examiner

*Primary Examiner* — Andargie M Aychillhum
(74) *Attorney, Agent, or Firm* — Kratz, Quintos & Hanson, LLP

(57) ABSTRACT

A wiring board includes a first wiring line and a second wiring line formed on a substrate, a first land and a second land respectively formed at a connection portion of the first wiring line and the second wiring line. A second wiring line has a longer wiring length than the first wiring line. The land is structured with a wiring pattern of a single wiring line. The wiring board also includes a first pad electrode and a second pad electrode respectively formed on the first land and a second land through an insulating film, a first interlayer connection via and a interlayer connection via embedded in the insulating film and electrically connecting the land to the pad electrode. And a wiring length of the wiring pattern of the first land is longer than the wiring length of the wiring pattern of the second land.

11 Claims, 15 Drawing Sheets

WIRING BOARD AND DESIGN METHOD FOR WIRING BOARD

CROSS-REFERENCE TO RELATED APPLICATION

This application is based upon and claims the benefit of priority of the prior Japanese Patent Application No. 2013-009120, filed on Jan. 22, 2013, the entire contents of which are incorporated herein by reference.

FIELD

The embodiments discussed herein are related to a wiring board and a design method for the wiring board.

BACKGROUND

As higher-density integration is realized for semiconductor chips such as a central processing unit (CPU) or an application-specific integrated circuit (ASIC), a connection-bump pitch has recently become smaller. It is desirable that a wiring board on which a semiconductor chip is mounted be able to cope with a small connection-bump pitch. Thus, instead of directly mounting a semiconductor chip on a package board composed of an existing ceramic substrate or an existing organic substrate, there have been cases where a silicon interposer is used between a semiconductor chip and a package board, the silicon interposer having advantages when performing fine patterning.

A silicon interposer has wiring layers on both surfaces, a semiconductor-chip mounting surface (a front surface) and a package-board connecting surface (a back surface), and silicon through vias are used to connect front-surface wiring and back-surface wiring. Note that, without forming silicon through vias and a back-surface wiring layer, a package board may be electrically connected to a semiconductor chip by wire bonding from a front surface of a silicon interposer.

There may be a case where it is desirable that wiring lines that transfer signals within a silicon interposer allow a plurality of signal transmission times to be made uniform like memory bus signals. This has been previously satisfied by performing meander processing in which, in an equal-length group in a silicon interposer, wiring lengths of wiring lines in the entire equal-length group are made to be equal to the wiring length of the longest wiring line in the equal-length group.

However, as wiring in a silicon interposer is made finer and comes to have higher density, it is more difficult to obtain a sufficiently large region for performing meander processing on a silicon interposer. Thus, a new wiring structure and a design method therefor have been desired that may make signal transmission times for a plurality of wiring lines be uniform even in the case of high-density wiring. The following documents are listed as examples of the related art, Japanese Laid-open Patent Publication No. 2003-152290, Japanese Laid-open Patent Publication No. 2004-031531, and Japanese Laid-open Patent Publication No. 2008-171950.

SUMMARY

According to an aspect of the invention, a wiring board includes a first wiring line formed on a substrate, a first land formed at a connection portion of the first wiring line and structured with a wiring pattern of a single wiring line, a second wiring line formed on the substrate and having a longer wiring length than the first wiring line, a second land formed at a connection portion of the second wiring line and structured with a wiring pattern of a single wiring line. The wiring board also includes a first pad electrode formed on the first land through an insulating film, a second pad electrode formed on the second land through the insulating film, a first interlayer connection via embedded in the insulating film and electrically connecting the first land to the first pad electrode, and a second interlayer connection via embedded in the insulating film and electrically connecting the second land to the second pad electrode. Furthermore, a wiring length of the wiring pattern of the first land between the connection portion of the first wiring line and the first interlayer connection via is longer than the wiring length of the wiring pattern of the second land between the connection portion of the second wiring line and a second interlayer connection via.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

First Embodiment

A wiring board and a manufacturing method therefore according to a first embodiment will be described with reference to FIGS. 1 to 14C.

Figure 1:
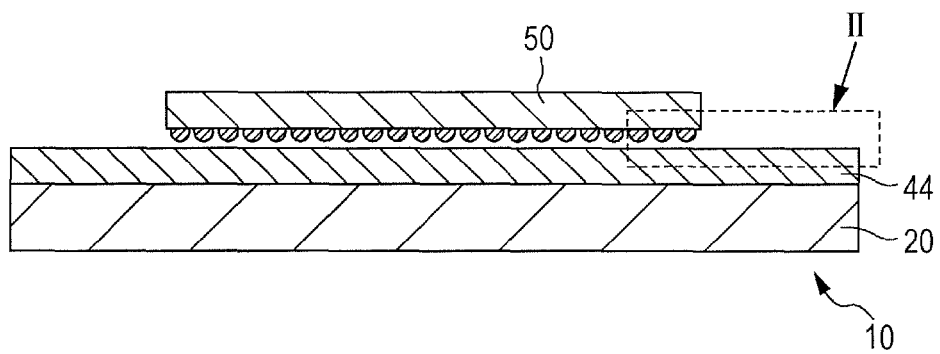
FIG. 1 is a schematic cross-sectional view (part 1) illustrating the structure of a wiring board according to a first embodiment.
Figure 2:
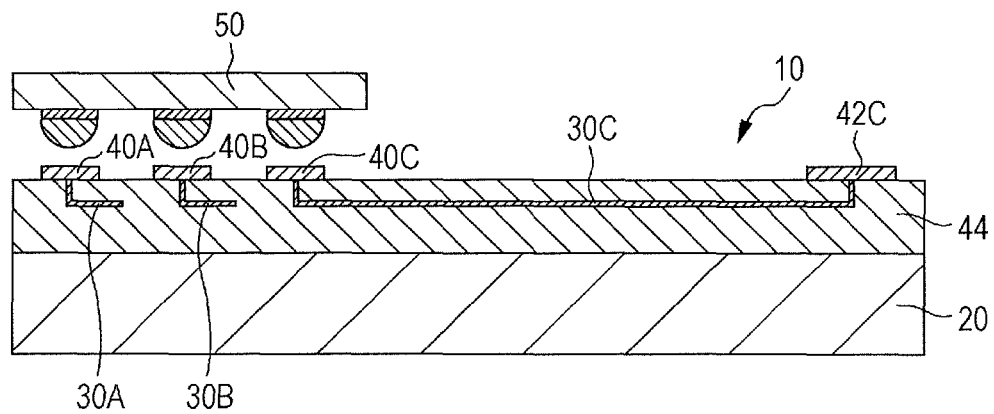
FIG. 2 is a schematic cross-sectional view (part 2) illustrating the structure of the wiring board according to the first embodiment.
Figure 3:
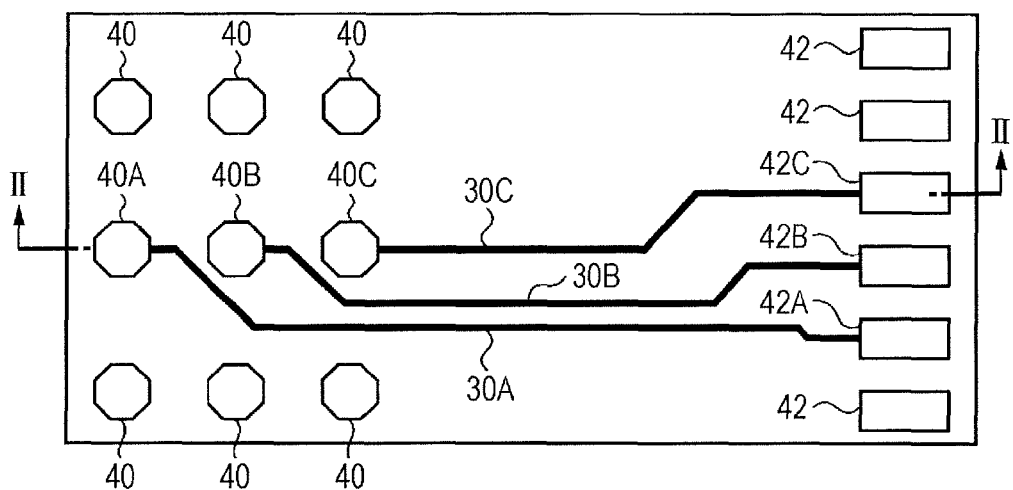
FIG. 3 is a plan view illustrating the structure of the wiring board according to the first embodiment.
Figure 4:
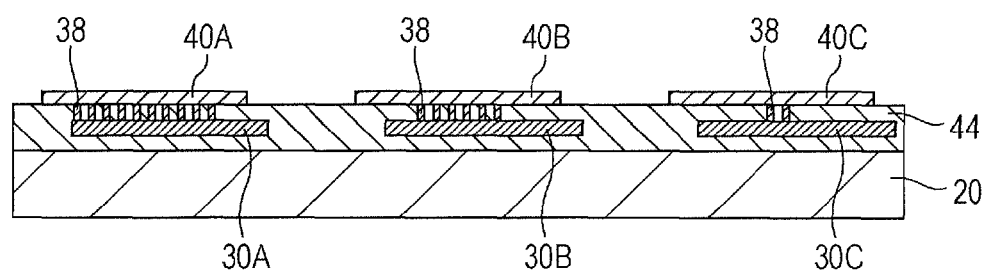
FIG. 4 is a schematic cross-sectional view (part 3) illustrating the structure of the wiring board according to the first embodiment.
Figure 5:
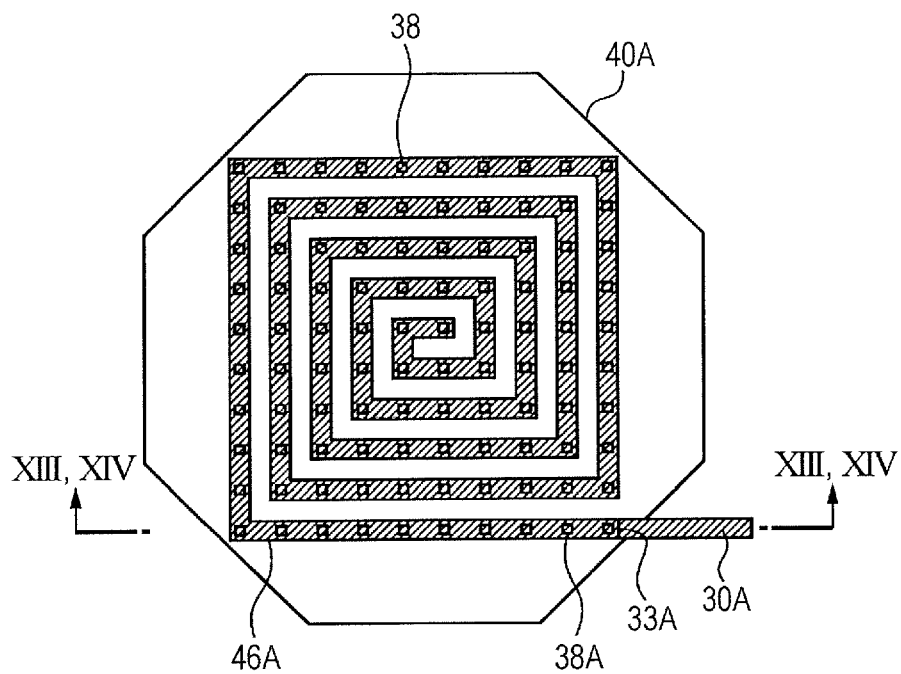
FIG. 5 is a plan view (part 1) illustrating the structure of the structure of a connection terminal portion of a wiring line in a wiring board according to the first embodiment.
Figure 6:
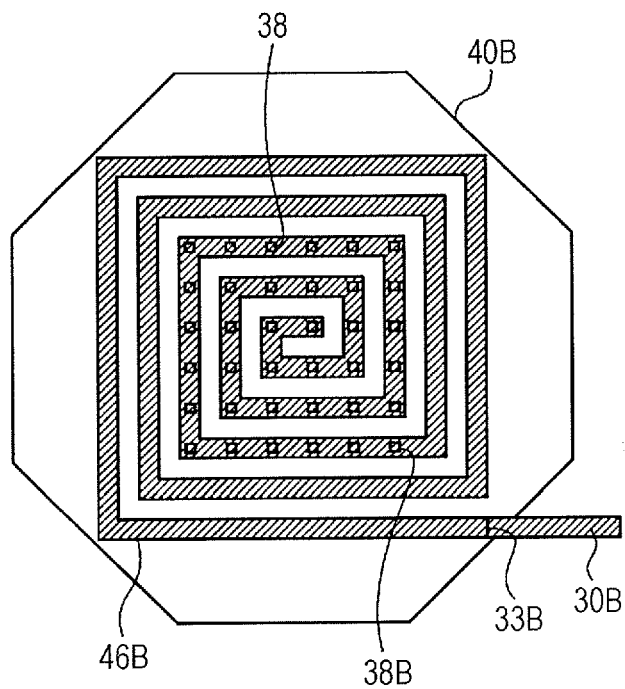
FIG. 6 is a plan view (part 2) illustrating the structure of the structure of a connection terminal portion of a wiring line in the wiring board according to the first embodiment.
Figure 7:
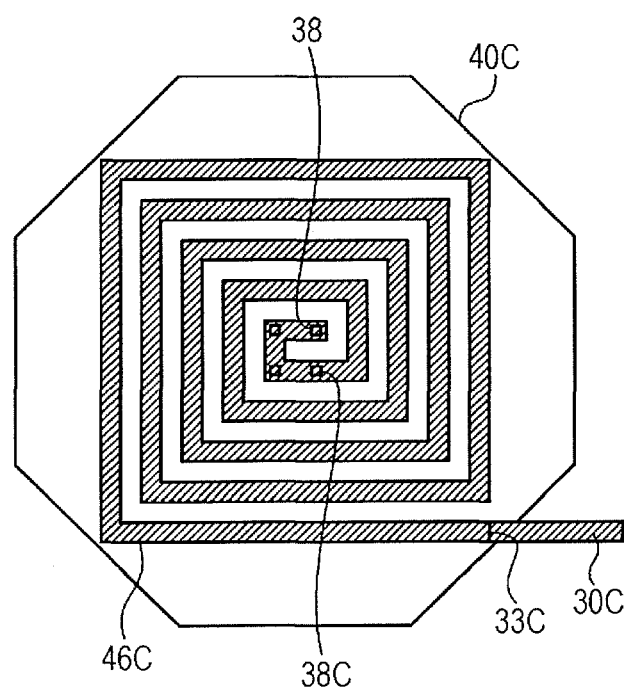
FIG. 7 is a plan view (part 3) illustrating the structure of the structure of a connection terminal portion of a wiring line in the wiring board according to the first embodiment.
Figure 8A:
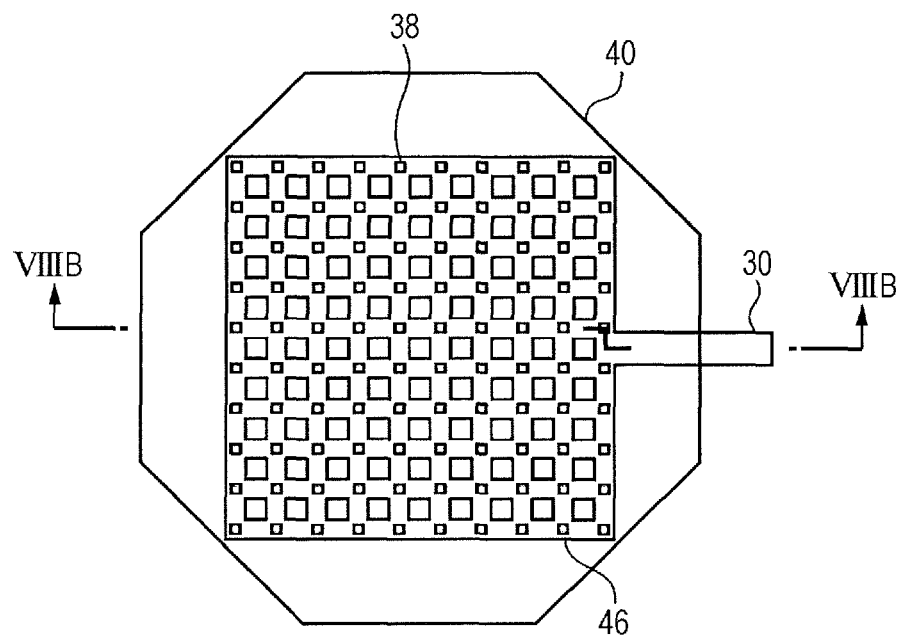
FIGS. 8A and 8B are a plan view and a cross-sectional view illustrating the structure of a connection terminal portion of a wiring line in a comparative example.
Figure 8B:
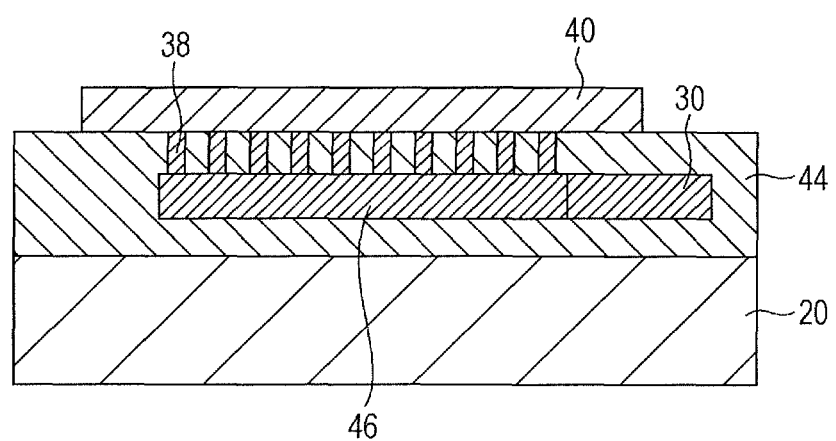
Figure 9:
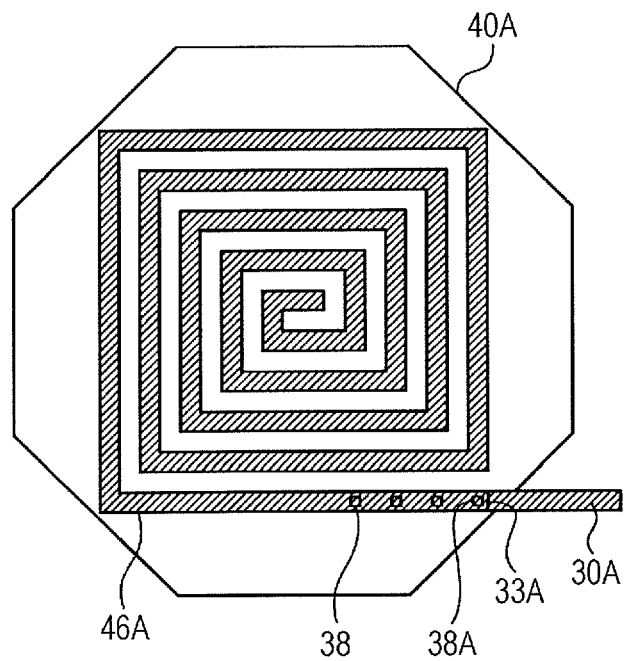
FIG. 9 is a plan view (part 1) illustrating the structure of a connection terminal portion of a wiring line in a wiring board in a modified example of the first embodiment.
Figure 10:
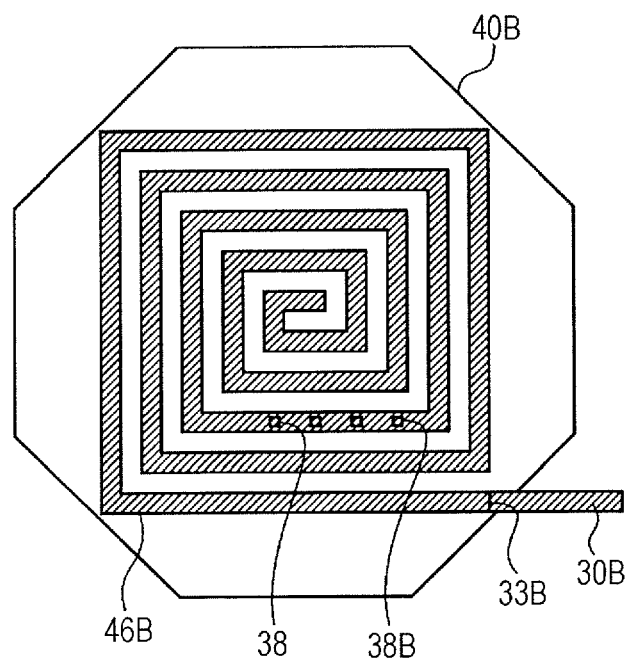
FIG. 10 is a plan view (part 2) illustrating the structure of a connection terminal portion of a wiring line in the wiring board in the modified example of the first embodiment.
Figure 11:
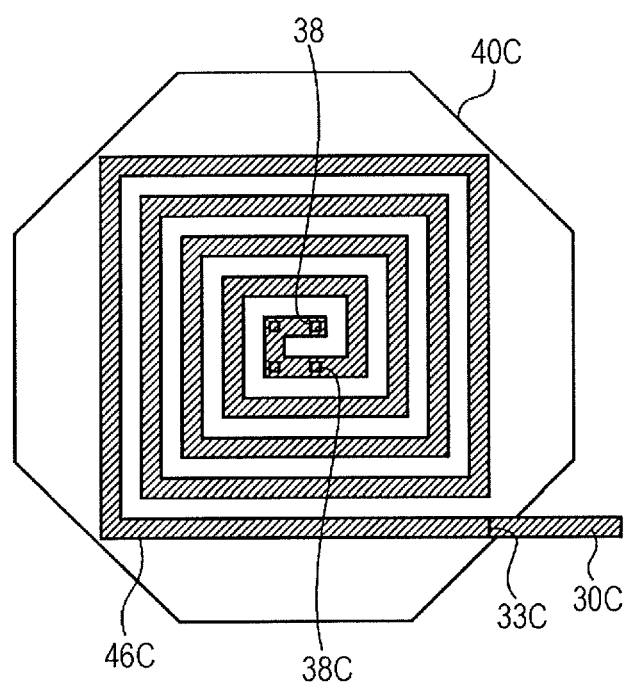
FIG. 11 is a plan view (part 3) illustrating the structure of a connection terminal portion of a wiring line in the wiring board in the modified example of the first embodiment.
Figure 12:
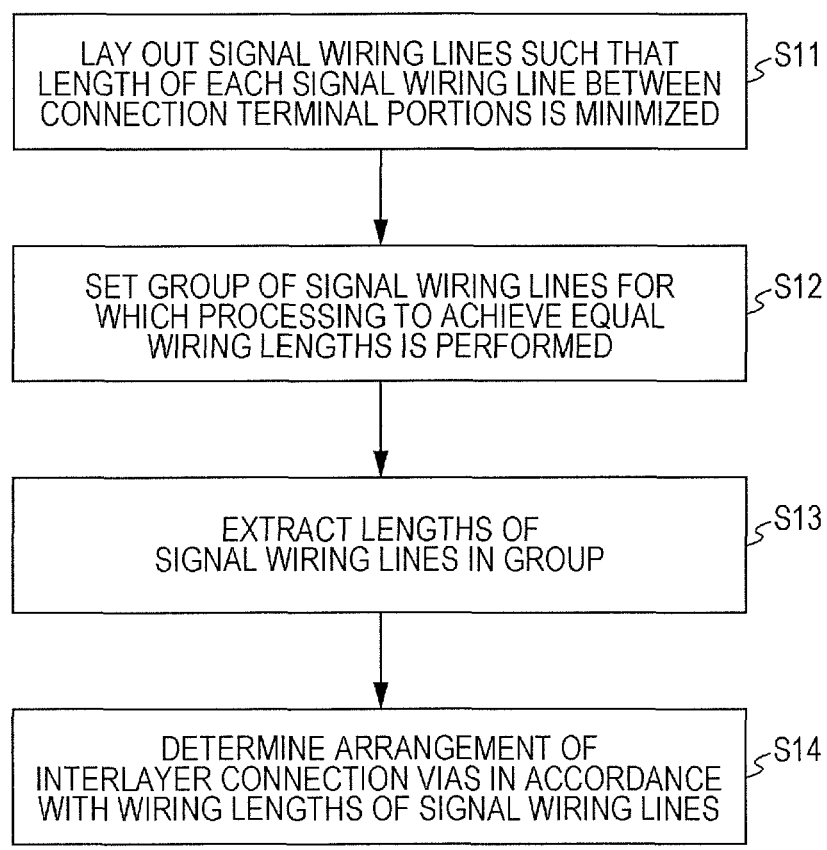
FIG. 12 is a flowchart illustrating a design method for a wiring board according to the first embodiment.

FIGS. 1, 2, and 4 are schematic cross-sectional views illustrating the structure of a wiring board according to the first embodiment. FIG. 3 is a plan view of the structure of a wiring board according to the first embodiment. FIGS. 5 to 7 are plan views of the structure of a connection terminal portion of a wiring line in a wiring board according to the first embodiment. FIGS. 8A and 8B are a plan view and a cross-sectional view illustrating the structure of a connection terminal portion of a wiring line in a wiring board in a comparative example. FIGS. 9 to 11 are plan views illustrating the structure of a connection terminal portion of a wiring line in a wiring board according to a modified example of the first embodiment. FIG. 12 is a flowchart illustrating a design method for a wiring board according to the first embodiment. FIGS. 13A to 14C are cross-sectional views illustrating a manufacturing process in a manufacturing method for a wiring board according to the first embodiment.

First, the structure of a wiring board according to the first embodiment will be described with reference to FIGS. 1 to 11.

As illustrated in FIG. 1, a wiring board 10 according to the first embodiment includes a substrate 20 and a multilayer wiring layer 44 formed on the substrate 20. A semiconductor chip 50 is mounted on the multilayer wiring layer 44.

FIG. 2 is an enlarged view of a portion encircled by a dotted line in FIG. 1. FIG. 3 is a top view of the wiring board 10 in the portion encircled by a dotted line in FIG. 1.

For example, as illustrated in FIG. 2, pad electrodes 40 (40A, 40B, and 40C) and external connection terminals 42 (42A, 42B, and 42C) are formed on a front surface of the multilayer wiring layer 44. The pad electrodes 40 are electrically connected to the external connection terminals 42 via wiring lines 30 (30A, 30B, and 30C) formed inside the multilayer wiring layer 44. As illustrated in FIGS. 2 and 3, the pad electrode 40A is electrically connected to the external connection terminal 42A via the wiring line 30A; the pad electrode 40B is electrically connected to the external connection terminal 42B via the wiring line 30B; and the pad electrode 40C is electrically connected to the external connection terminal 42C via the wiring line 30C.

Here, the wiring lines 30A, 30B, and 30C belong to a group of wiring lines that allow a plurality of signal transmission times to be made uniform, for example, like memory bus signals. In addition, for example, as illustrated in FIG. 3, the wiring line 30C, the wiring line 30B, and the wiring line 30A are listed in ascending order in terms of wiring length.

FIG. 4 is a cross-sectional view illustrating details of connection portions of the wiring lines 30 and the pad electrodes 40. FIGS. 5 to 7 are plan views illustrating arrangement of the wiring lines 30A to 30C and interlayer connection vias 38 for the pad electrodes 40A to 40C.

For example, as illustrated in FIGS. 5 to 7, the pad electrodes 40A to 40C have planar shapes that are identical to each other in terms of shape and size. The planar shape of the pad electrodes 40A to 40C is not specifically limited and other than a regular octagonal shape as illustrated in FIGS. 5 to 7 a circle shape or a polygonal shape such as a square may be used.

For example, as illustrated in FIGS. 5 to 7, the wiring line 30A includes a land 46A in a region under the pad electrode 40A, the wiring line 30B includes a land 46B in a region under the pad electrode 40B, and the wiring line 30C includes a land 46C in a region under the pad electrode 40C. The land 46A is formed by a wiring pattern extending from the main portion of the wiring line 30A, the land 46B is formed by a wiring pattern extending from the main portion of the wiring line 30B, and the land 46C is formed by a wiring pattern extending from the main portion of the wiring line 30C. The land 46A is a region for connecting the wiring line 30A to the pad electrode 40A, the land 46B is a region for connecting the wiring line 30B to the pad electrode 40B, and the land 46C is a region for connecting the wiring line 30C to the pad electrode 40C. The lands 46A to 46C have wiring patterns that are identical to each other in terms of shape and size. The wiring pattern that forms the lands 46A to 46C is not limited to specific patterns. However, it is desirable that the wiring pattern be formed by a single wiring line without branch lines from the point of view of expanding a scope of the wiring line in which equal-length wiring may be formed. From this point of view, in a wiring board according to the first embodiment, the lands 46A to 46C are each formed by a wiring pattern that is formed by a single wiring line without branch lines and that has a rectangular spiral shape.

Note that, for convenience of description in the present specification, portions of the wiring lines 30A to 30C in regions under the pad electrodes 40A to 40C are called the lands 46A to 46C. In the case where it is desired that the lands 46A to 46C be distinguished from the wiring lines 30A to 30C, portions of the wiring lines 30A to 30C that do not include the lands 46A to 46C (the main portions of the wiring lines) may be called the wiring lines 30A to 30C. In this case, an end portion of the wiring pattern that forms the lands 46A to 46C, the end portion of the wiring pattern being close to the external connection terminals 42A to 42C (a portion in a region under the pad electrodes 40A to 40C and at the border of the pad electrodes 40A to 40C) is called an end portions 33A to 33C of the lands 46A to 46C. An end portion of the wiring pattern that forms the land 46B, the end portion of the wiring pattern being close to the external connection terminal 42B, (a portion in a region under the pad electrode 40B and at the border of the pad electrode 40B) is called an end portion 33B of the land 46B. An end portion of the wiring pattern that forms the land 46C, the end portion of the wiring pattern being close to the external connection terminal 42C (a portion in a region under the pad electrodes 40A to 40C and at the border of the pad electrodes 40A to 40C) is called an end portion 33C of the land 46C. In addition, end portions of the wiring lines 30A to 30C next to the lands 46A to 46C are called connection portions.

As illustrated in FIGS. 4 to 7, the wiring lines 30A to 30C are electrically connected to the pad electrodes 40A to 40C, respectively, via interlayer connection vias 38. Arrangement of the interlayer connection vias 38 that connect the pad electrodes 40A to 40C to the wiring lines 30A to 30C, respectively, is changed in accordance with the wiring lengths of the wiring lines 30A to 30C. That is, the interlayer connection vias 38 are arranged such that the longer the wiring length of a wiring line 30 connected to a pad electrode 40 is, the shorter the wiring distance from an end portion 33 of a land 46 to the interlayer connection via 38 closest to the end portion 33 of the land 46 is. In addition, the longer the wiring length of a wiring line 30 connected to a pad electrode 40 is, the greater number of interlayer connection vias 38 connecting the wiring line 30 and the pad electrode 40 is.

Specifically, the land 46A, the land 46B, and the land 46C are listed in ascending order with respect to the wiring distance from an end portion 33 of a land 46 to the interlayer connection via 38 closest to the end portion 33. In addition, the number of interlayer connection vias 38 that connect the wiring line 30A to the pad electrode 40A is greater than the number of interlayer connection vias 38 that connect the wiring line 30B to the pad electrode 40B. The number of interlayer connection vias 38 that connect the wiring line 30B to the pad electrode 40B is greater than the number of interlayer connection vias 38 that connect the wiring line 30C to the pad electrode 40C.

For example, in the case where the pad electrodes 40A to 40C have an octagonal shape of about 50 μm in length and width, when a wiring pattern having a wiring line width of 1 μm is arranged in a spiral shape with a 2 μm pitch, the lands 46A to 46C having a certain rectangular shape with sides of 30 μm may be formed. When interlayer connection vias 38 having a quadrangle shape of 0.5 μm in length and width are arranged with a 2-μm gap therebetween on the lands 46A to 46C, up to 100 interlayer connection vias 38 may be arranged on the lands 46A to 46C.

In this case, for example, as illustrated in FIG. 5, the wiring line 30A is electrically connected to the pad electrode 40A via 100 interlayer connection vias 38, 100 being the maximum number.

In addition, for example, as illustrated in FIG. 6, the wiring line 30B is electrically connected to the pad electrode 40B via 36 interlayer connection vias 38 arranged in order from the end portion of the land 46B at the center of the scroll wiring pattern of the land 46B. The wiring distance from the end portion 33B of the land 46B to an interlayer connection via 38B, which is closest to the end portion 33B, is longer than the wiring distance from the end portion 33A of the land 46A to an interlayer connection via 38A, which is closest to the end portion 33A. In other words, the actual wiring-length difference between the wiring line 30A and the wiring line 30B may be shortened by the difference between the wiring distance from the end portion 33B of the land 46B to the interlayer connection via 38B, which is closest to the end portion 33B, and the wiring distance from the end portion 33A of the land 46A to the interlayer connection via 38A, which is closest to the end portion 33A.

In addition, for example, as illustrated in FIG. 7, the wiring line 30C is electrically connected to the pad electrode 40C via four interlayer connection vias 38 arranged in order from the end portion of the land 46C at the center of the scroll wiring pattern of the land 46C. The wiring distance from the end portion 33C of the land 46C to an interlayer connection via 38C, which is closest to the end portion 33C, is longer than the wiring distance from the end portion 33B of the land 46B to the interlayer connection via 38B, which is closest to the end portion 33B. In other words, the actual wiring-length difference between the wiring line 30B and the wiring line 30C may be shortened by the difference between the wiring distance from the end portion 33C of the land 46C to the interlayer connection via 38C, which is closest to the end portion 33C, and the wiring distance from the end portion 33B of the land 46B to the interlayer connection via 38B, which is closest to the end portion 33B.

Note that one of the reasons why the lands 46A to 46C are formed by wiring patterns extending from the wiring lines 30A to 30C, respectively, is to make it possible to use a damascene process at the time of manufacturing of the multilayer wiring layer 44. This is because a fine wiring pattern is desired on the multilayer wiring layer 44 formed on the substrate 20, especially, on the multilayer wiring layer 44 on a front surface side where a semiconductor chip is to be mounted, and it is desirable that a damascene process by which a wiring line of 1 μm or smaller is easily formed be employed.

In a damascene process, in a chemical-mechanical planarization (CMP) process for forming inner-layer wiring, forming a wiring pattern having a large area is normally not allowed to avoid a phenomenon in which the height of a wiring member becomes lower than that of a surrounding insulation member, what is called dishing. In contrast, topmost-surface wiring (the pad electrodes 40, the external connection terminals 42, and the like) is formed without using a CMP process under no size constraints, and thus a continuous wiring pattern having a large area may be formed. As a result, there is a large difference in wiring pattern area between the inner-layer wiring and the topmost-surface wiring.

Thus, in order to reduce this difference, an inner-layer wiring pattern is connected to a topmost-surface wiring pattern by using a multi-via structure in which a plurality of vias are arranged. In addition, a region (land) of an inner-layer wiring pattern connected to multiple vias has a shape such as an aggregate of fine wiring lines (for example, a grid pattern). FIGS. 8A and 8B are a plan view and a cross-sectional view, respectively, illustrating a typical wiring structure in which a land 46 is formed in a grid pattern and an inner-layer wiring pattern is connected to a topmost-surface wiring pattern by using a multi-via structure.

Note that, in the above-described examples, the longer the wiring distance of a wiring line 30 connected to a pad electrode 40, the greater number of interlayer connection vias 38 that connect the wiring line 30 and the pad electrode 40; however, for wiring lines that are different in wiring length, the number of interlayer connection vias 38 does not have to differ from wiring line to wiring line on every occasion.

Increasing the number of interlayer connection vias 38 has an effect in shortening a transmission delay time, similarly to the case where the wiring distance from an end portion 33 of a land 46 to the interlayer connection via 38 closest to the end portion 33 is shortened. However, it is conceivable that there could be a case where variations in transmission delay time may be reduced and fall within a desired range only by adjusting the wiring distance from an end portion 33 of a land 46 to the interlayer connection via 38 closest to the end portion 33. In such a case, the number of interlayer connection vias 38 does not have to be changed.

For example, as illustrated in FIGS. 9 to 11, only the wiring distance from an end portion 33 of a land 46 to the interlayer connection via 38 closest to the end portion 33 may be changed, and the number of interlayer connection vias 38 that connect the wiring line 30A to the pad electrode 40A, the number of interlayer connection vias 38 that connect the wiring line 30B to the pad electrode 40B, and the number of interlayer connection vias 38 that connect the wiring line 30C to the pad electrode 40C may be identical to each other. FIGS. 9 to 11 illustrate examples in which four interlayer connection vias 38 connect each of the wiring lines 30A to 30C to a corresponding one of the pad electrodes 40A to 40C.

In order to confirm advantages of a wiring board according to the first embodiment, wiring configurations illustrated in FIGS. 5 to 7 were each formed at end portions of wiring lines whose wiring lengths were 0.2 mm, 0.15 mm, and 0.1 mm, and differences in signal transmission time were measured. In addition, for comparison, a wiring configuration illustrated in FIGS. 8A and 8B is formed at end portions of wiring lines whose wiring lengths were 0.2 mm, 0.15 mm, and 0.1 mm and differences in signal transmission time were measured also for the wiring lines. As a result, in contrast to the case of a wiring board used in the comparative example, it was confirmed for the wiring board according to the first embodiment that a difference between a transmission delay time for the wiring line whose wiring length is 0.2 mm and a transmission delay time for the wiring line whose wiring length is 0.1 mm may be reduced by about 70%.

A signal delay time changes in accordance with not only a wiring length but also with a line width of a wiring line, a thickness of a wiring line, a constituent material of a wiring line, a manufacturing method, or the like. In order to compensate for variations in delay time, it is desirable that the arrangement of interlayer connection vias 38 be set as appropriate by taking a line width of a wiring line, a thickness of a wiring line, a constituent material of a wiring line, a manufacturing method, or the like into account.

Next, a design method for a wiring board according to the first embodiment will be described with reference to FIG. 12.

First, signal wiring lines are laid out in a wiring board such that the length of each signal wiring line between connection terminal portions of the signal wiring line is minimized (step S11).

Next, a group of signal wiring lines for which processing to achieve equal wiring lengths is performed is set from among signal wiring lines (step S12).

Next, the wiring length of each signal wiring line in the group of signal wiring lines is extracted from a design drawing (step S13).

Next, in accordance with the extracted wiring length of each signal wiring line, the arrangement of interlayer connection vias 38 is determined (step S14). Note that, as parameters for determining the arrangement of interlayer connection vias 38, a wiring distance from an end portion 33 of a land 46 to the interlayer connection via 38 closest to the end portion 33 and the number of interlayer connection vias 38 arranged are included.

For example, relationships among a wiring distance from an end portion 33 of a land 46 to an interlayer connection via 38 closest to the end portion 33, the number of interlayer connection vias 38, and a signal delay time are stored in advance in a database. In accordance with the wiring lengths of signal wiring lines and differences between the wiring lengths of the signal wiring lines, a wiring distance from an end portion 33 of a land 46 to the interlayer connection via 38 closest to the end portion 33 and the number of interlayer connection vias 38 are determined as appropriate such that variations in signal delay time fall within a desired range.

In a design method for a wiring board according to the first embodiment, the only layer subjected to layout change for forming equal-length wiring is the layer of interlayer connection vias 38. The layer of wiring lines 30 is not subjected to layout change. Thus, the number of man-hours taken to form equal-length wiring may be significantly reduced.

Variations in signal delay time for the signal wiring lines included in the group for which processing to achieve equal wiring lengths is performed may be reduced by designing, in this manner, the structure of connection terminal portions of the wiring lines included in the group.

Next, a manufacturing method for a wiring board according to the first embodiment will be described with reference to FIGS. 13A to 14C. Note that FIGS. 13A to 14C are cross-sectional views illustrating a manufacturing process and taken along lines XIII-XIII and XIV-XIV of FIG. 5.

First, the substrate 20, which will be the base of the wiring board 10, is prepared. In the case where a wiring board is a silicon interposer, for example, an 8-inch or 12-inch silicon wafer is used as the substrate 20. In addition, through vias and a wiring layer, which is an underlying layer, may be formed on the substrate 20.

Next, a silicon oxide film having, for example, a film thickness of 1 µm is deposited on the substrate 20 by, for example, a chemical vapor deposition (CVD) method, and an insulating film 24 composed of a silicon oxide film is formed.

Figure 13A:
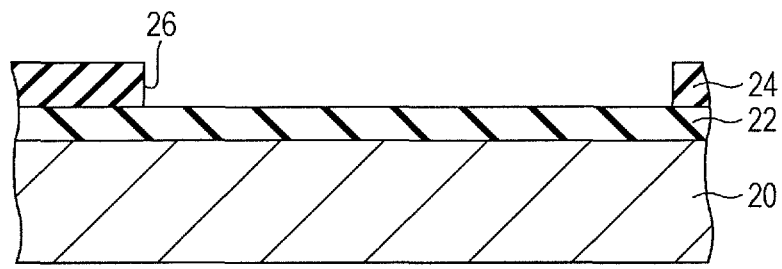
FIGS. 13A to 13D are cross-sectional views (part 1) illustrating a manufacturing method for a wiring board according to the first embodiment.

Next, a wiring groove 26 is formed in a wiring formation region of the insulating film 24 by photolithography and etching (FIG. 13A).

Figure 13B:
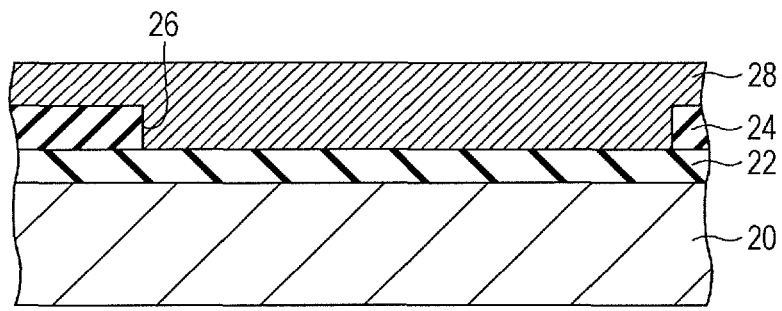

Next, a copper (Cu) film 28 having, for example, a film thickness of 1 µm is formed by, for example, an electrolytic plating method on the insulating film 24 in which the wiring groove 26 is formed (FIG. 13B). For example, an adhesion layer composed of a Ti film or the like may be formed as the base of the Cu film 28 as appropriate.

Next, the Cu film 28 on the insulating film 24 is removed by, for example, a CMP method.

Figure 13C:
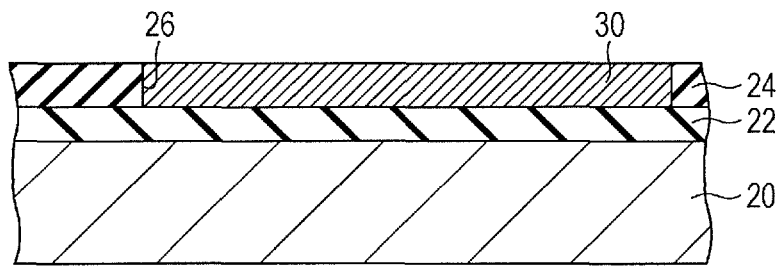

In this manner, a wiring line 30 embedded in the wiring groove 26 is formed by what is called a damascene method (FIG. 13C).

Two line-and-space patterns in each of which wiring lines having a line width of 1 µm are arranged with a 2-µm pitch are arranged so as to be orthogonal to each other at a connection terminal portion of a wiring line 30. As a result, a land 46 having a grid pattern is formed. The number of lines in a line pattern that forms a land 46 is appropriately set on the basis of the wiring lengths of signal wiring lines for which processing to achieve equal wiring lengths is performed in accordance with the above-described design procedure. For example, the land 46A has ten lines, the land 46B has four lines, and the land 46C has one line.

Note that, in the case where a wiring layer (not illustrated) is formed under an insulating layer 22, wiring lines 30 connected to the wiring layer under the insulating layer 22 may be formed by what is called a dual damascene method.

Next, a silicon oxide film having, for example, a film thickness of 1 µm is deposited by, for example, a CVD method on the insulating film 24 in which the wiring line 30 is embedded, and an insulating film 32 composed of a silicon oxide film is formed.

Figure 13D:
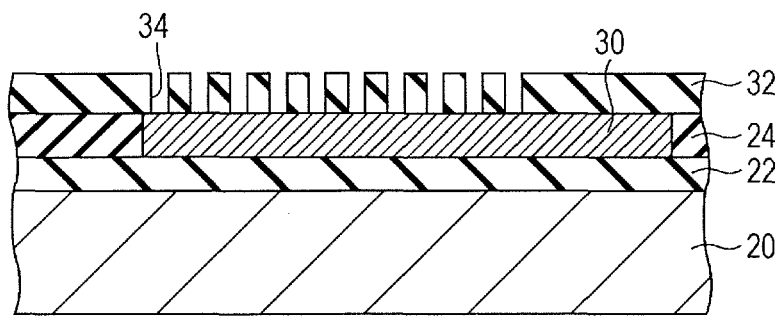

Next, a plurality of via holes 34 reaching the wiring line 30 are formed in the insulating film 32 by photolithography and etching (FIG. 13D).

Figure 14A:
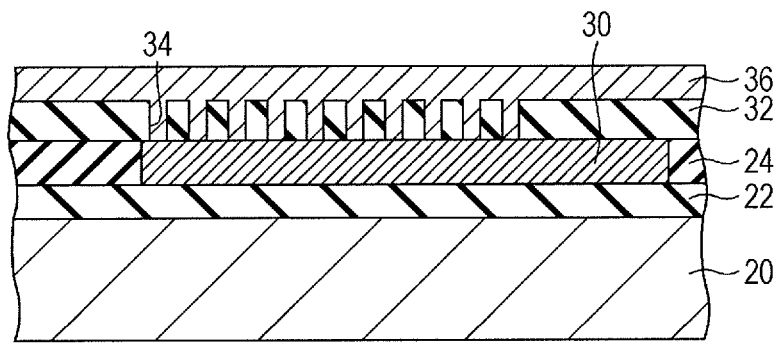
FIGS. 14A to 14C are cross-sectional views (part 2) illustrating a manufacturing method for a wiring board according to the first embodiment.

Next, a tungsten (W) film 36 is formed by, for example, a sputtering method on the insulating film 32 in which the via holes 34 are formed (FIG. 14A). For example, a barrier film composed of a titanium nitride (TiN) film or the like may be formed as the base of the W film 36 as appropriate.

Figure 14B:
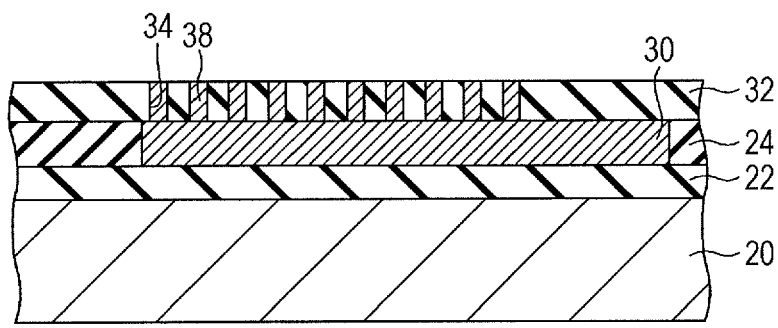

Next, the W film 36 on the insulating film 32 is removed by, for example, a CMP method and interlayer connection vias 38 embedded in via holes 34 are formed (FIG. 14B). For example, interlayer connection vias 38, which measure 0.5 μm per side, are arranged with a 2-μm pitch, for example, on grid points of the grid pattern of a land 46.

Next, an aluminum (Al) film having, for example, a film thickness of 1.5 μm is formed on the entire surface by, for example, a sputtering method. For example, a barrier film composed of a TiN film or the like may be formed as the base of the Al film as appropriate.

Figure 14C:
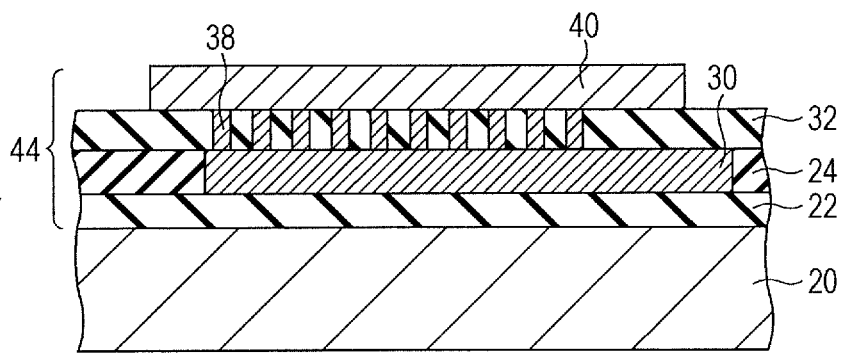

Next, patterning is performed on the Al film by photolithography and etching and a pad electrode 40 is formed (FIG. 14C).

In this manner, manufacturing of the wiring board 10 according to the first embodiment is completed.

In this manner, in the first embodiment, a land is formed using a wiring pattern extending from the main portion of a wiring line and the arrangement of interlayer connection vias that connect a wiring line and a land is determined in accordance with the wiring length of the wiring line. Thus, signal transmission times for wiring lines having different wiring lengths may be made uniform. As a result, meander processing may be omitted or simplified meander processing may be performed, and wiring that realizes higher density may be more easily formed.

Second Embodiment

A wiring board and a manufacturing method therefor according to a second embodiment will be described with reference to FIGS. 15 to 20. Components similar to those of the wiring board and the manufacturing method therefor illustrated in FIGS. 1 to 14C are denoted by the same reference numerals and description thereof will be omitted or briefly stated.

Figure 15:
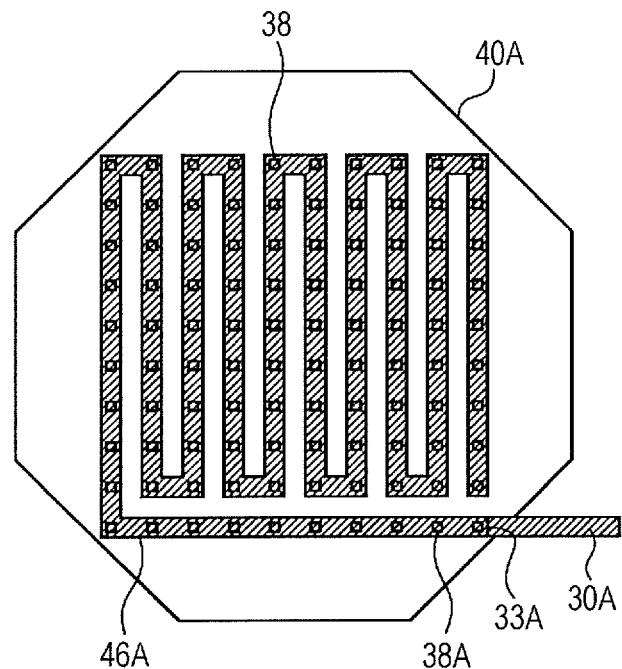
FIG. 15 is a plan view (part 1) illustrating the structure of a connection terminal portion of a wiring line in a wiring board according to a second embodiment.
Figure 16:
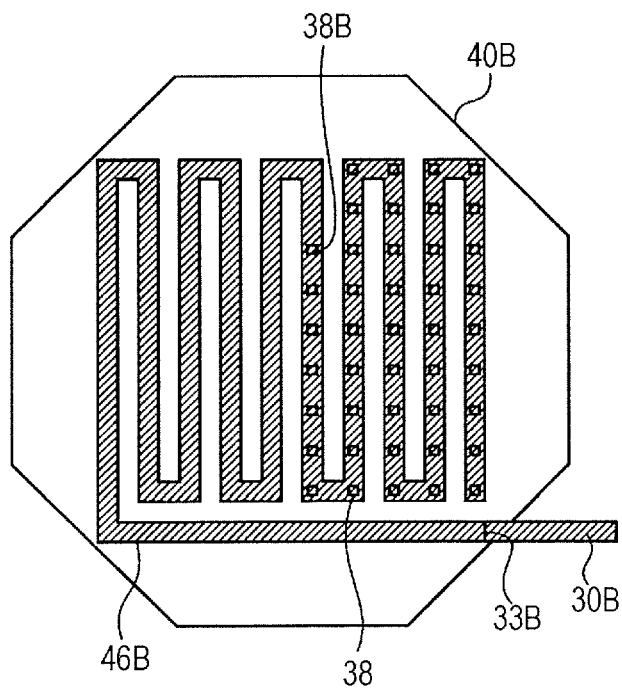
FIG. 16 is a plan view (part 2) illustrating the structure of a connection terminal portion of a wiring line in the wiring board according to the second embodiment.
Figure 17:
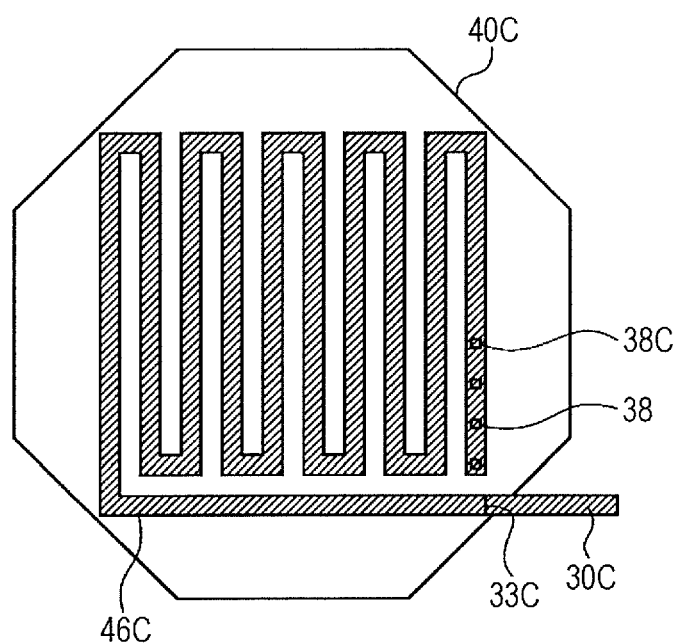
FIG. 17 is a plan view (part 3) illustrating the structure of a connection terminal portion of a wiring line in the wiring board according to the second embodiment.
Figure 18:
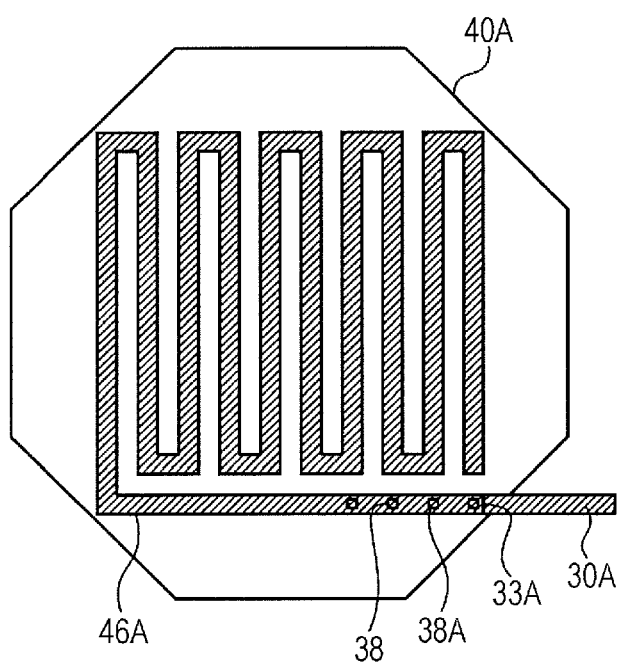
FIG. 18 is a plan view (part 1) illustrating the structure of a connection terminal portion of a wiring line in a wiring board according to a modified example of the second embodiment.
Figure 19:
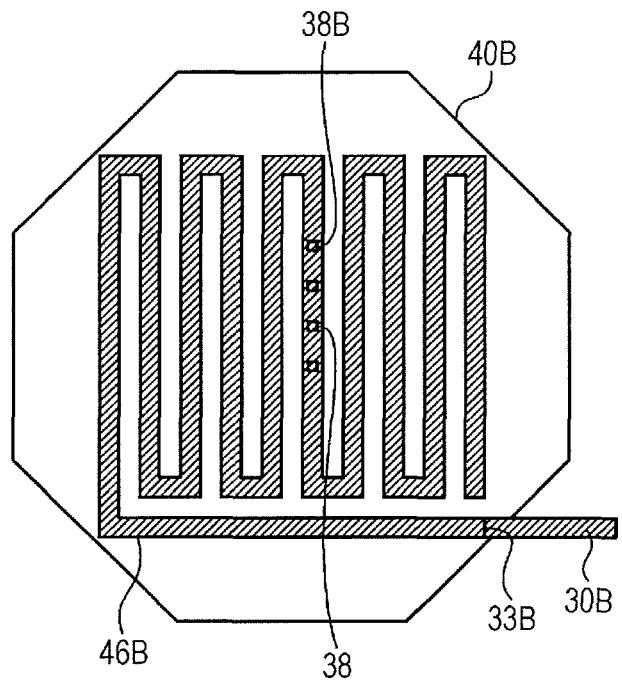
FIG. 19 is a plan view (part 2) illustrating the structure of a connection terminal portion of a wiring line in the wiring board according to the modified example of the second embodiment.
Figure 20:
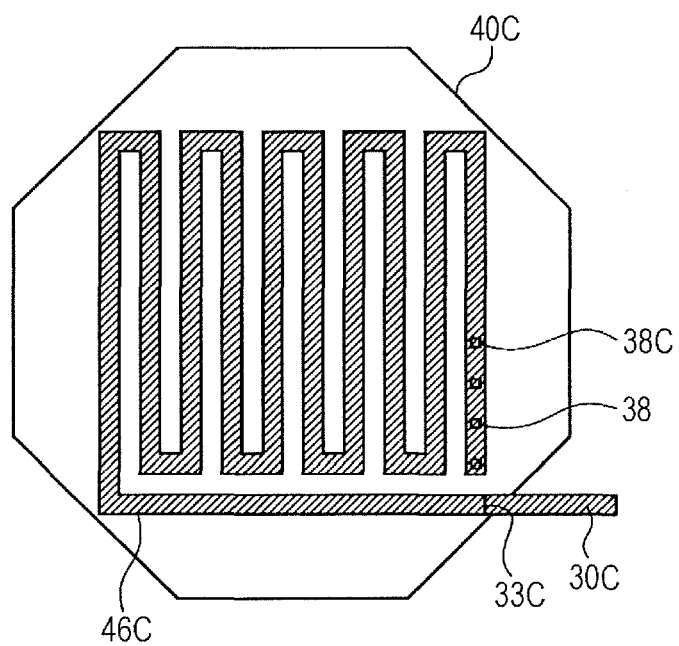
FIG. 20 is a plan view (part 3) illustrating the structure of a connection terminal portion of a wiring line in the wiring board according to the modified example of the second embodiment.

FIGS. 15 to 17 are plan views illustrating the structure of a connection terminal portion of a wiring line in a wiring board according to the second embodiment. FIGS. 18 to 20 are plan views illustrating a connection terminal portion of a wiring line in a wiring board according to a modified example of the second embodiment.

A wiring board according to the second embodiment is similar to a wiring board according to the first embodiment except that, as illustrated in FIGS. 15 to 17, a wiring pattern that forms the lands 46A, 46B, and 46C is different from that in the first embodiment. That is, in the wiring board according to the first embodiment, the lands 46A, 46B, and 46C are each formed by a single wiring line without branch lines and having a wiring pattern formed in a rectangular spiral shape. In contrast, in the wiring board according to the second embodiment, the lands 46A, 46B, and 46C are each formed by a single wiring line without branch lines and having a wiring pattern formed in a meandering shape.

It is estimated that the inductance component of a wiring pattern having a meandering shape such as in the case of a wiring board according to the second embodiment is lower than that of a wiring pattern having a spiral shape such as in the case of a wiring board according to the first embodiment. Thus, it is expected that a wiring board according to the second embodiment has an effect in reducing a signal delay or changes in signal waveform in a land 46. On the other hand, in the case of a wiring board according to the first embodiment, a signal delay due to the inductance component of a wiring pattern having a spiral shape may be positively used and applied to processing to achieve equal wiring lengths.

FIGS. 18 to 20 illustrate examples in which, similarly to FIGS. 9 to 11 illustrated in the first embodiment, only the wiring distance from an end portion 33 of a land 46 to the interlayer connection via 38 closest to the end portion 33 is changed, and the number of interlayer connection vias 38 that connect the wiring line 30A to the pad electrode 40A, the number of interlayer connection vias 38 that connect the wiring line 30B to the pad electrode 40B, and the number of interlayer connection vias 38 that connect the wiring line 30C to the pad electrode 40C are identical to each other. FIGS. 18 to 20 illustrate examples in which four interlayer connection vias 38 connect each of the wiring lines 30A to 30C to a corresponding one of the pad electrodes 40A to 40C.

A design method and a manufacturing method for a wiring board according to the second embodiment are similar to the design method and the manufacturing method for a wiring board according to the first embodiment.

In this manner, in the second embodiment, a land is formed using a wiring pattern extending from the main portion of a wiring line and the arrangement of interlayer connection vias that connect a wiring line and a land is determined in accordance with the wiring length of the wiring line. Thus, signal transmission times for wiring lines having different wiring lengths may be made uniform. As a result, meander processing may be omitted or simplified meander processing may be performed, and wiring that realizes higher density may be more easily formed.

Modified Embodiment

Various modifications are permissible in addition to the above-described embodiments.

For example, in the above-described embodiments, examples in which a silicon interposer is used as a wiring board are described. However, the above-described embodiments may be applied to various wiring boards for which processing to achieve equal wiring lengths is performed for signal wiring lines.

In addition, in the above-described embodiments, cases where the above-described wiring patterns are applied to connection terminal portions of wiring lines that connect pad electrodes to external connection terminals are described; however, wiring connection configurations are not limited to those.

Figure 21:
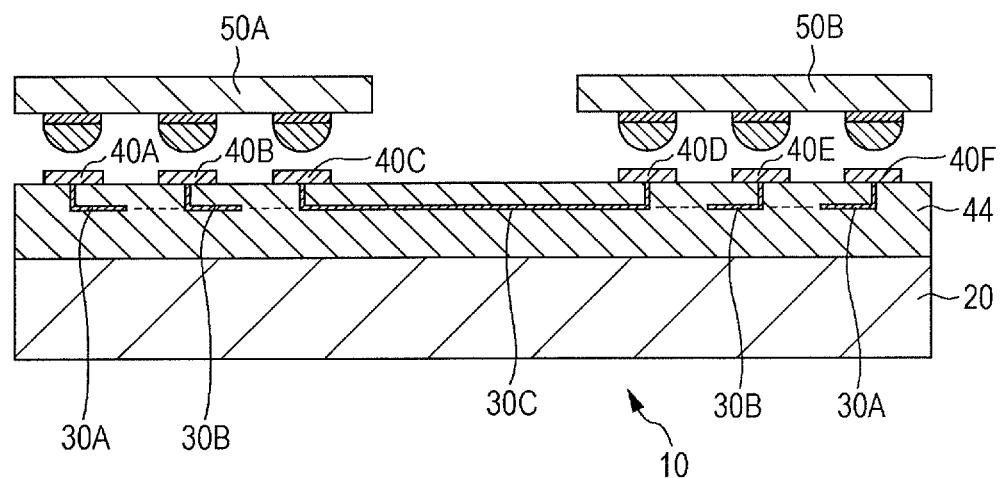
FIG. 21 is a schematic cross-sectional view (part 1) illustrating the structure of a wiring board according to a modified embodiment.

For example, as illustrated in FIG. 21, in the wiring board 10 on which a plurality of semiconductor chips 50 are mounted, wiring structures described in the above-described embodiments may be applied to connection terminal portions of wiring lines that connect certain pad electrodes, to each other, connected to the semiconductor chips 50.

The wiring board 10 illustrated in FIG. 21 includes the pad electrodes 40A, 40B, and 40C, to which a semiconductor chip 50A is connected, and pad electrodes 40D, 40E, and 40F, to which a semiconductor chip 50B is connected. The pad electrode 40C and the pad electrode 40D are electrically connected to each other via a wiring line 30C. In addition, the pad electrode 40B and the pad electrode 40E are electrically connected to each other via a wiring line 30B, which has a longer wiring length than the wiring line 30C. In addition, the pad electrode 40A and the pad electrode 40F are electrically connected to each other via a wiring line 30A, which has a longer wiring length than the wiring line 30B.

In such a case, for example, the structure illustrated in FIG. 5 may be applied to a connection terminal portion between the wiring line 30A and the pad electrode 40A and a connection terminal portion between the wiring line 30A and the pad electrode 40F. In addition, for example, the structure illustrated in FIG. 6 may be applied to a connection terminal portion between the wiring line 30B and the pad electrode 40B and a connection terminal portion between the wiring line 30B and the pad electrode 40E. In addition, for example, the structure illustrated in FIG. 7 may be applied to a connection terminal portion between the wiring line 30C and the pad electrode 40C and a connection terminal portion between the wiring line 30C and the pad electrode 40D.

Moreover, connection terminal portions at both ends of the wiring lines 30A, 30B, and 30C do not have to have the same structure. For example, the connection terminal portions of the wiring line 30B will be described as an example. The structure illustrated in FIG. 5 may be applied to the connection terminal portion between the wiring line 30B and the pad electrode 40B and the structure illustrated in FIG. 6 may be applied to the connection terminal portion between the wiring line 30B and the pad electrode 40E. A wiring delay time in the case where both connection terminal portions of the wiring line 30B have the structure illustrated in FIG. 6 may be made different from that in the case where one of the connection terminal portions of the wiring line 30B has the structure illustrated in FIG. 6.

Figure 22:
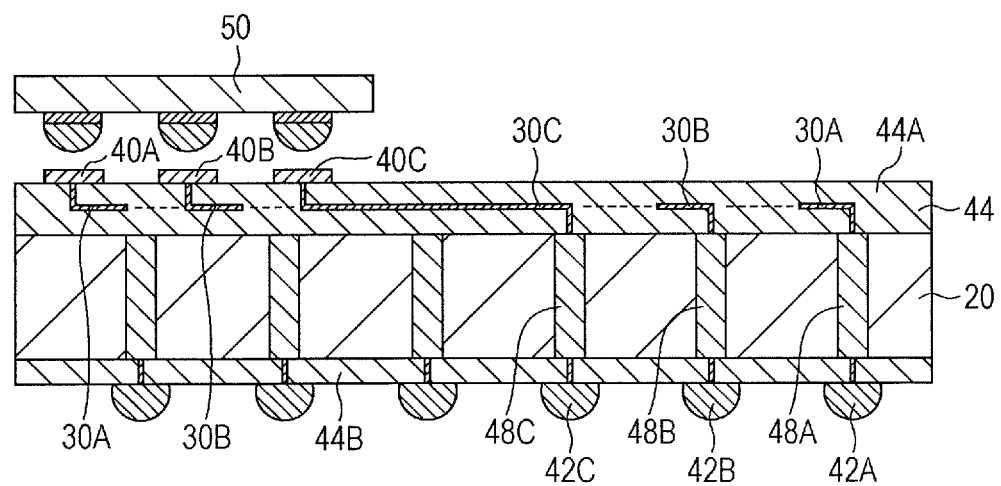
FIG. 22 is a schematic cross-sectional view (part 2) illustrating the structure of a wiring board according to a modified embodiment.

Alternatively, as illustrated in FIG. 22, in a wiring board in which pad electrodes 40 connected to a semiconductor chip 50 are formed on a front-surface side and external connection terminals 42 are formed on a back-surface side, a structure described in the above-described embodiments may be applied to a connection terminal portion of a wiring line.

The wiring board illustrated in FIG. 22 includes a multilayer wiring layer 44A formed on a front-surface side of the substrate 20 and a multilayer wiring layer 44B formed on a back-surface side of the substrate 20. Through vias 48 are embedded in the substrate 20, and a wiring layer on the front-surface side of the substrate 20 is connected to a wiring layer on the back-surface side of the substrate 20 via the through vias 48. The pad electrode 40C, which is on the front-surface side, and the external connection terminal 42C, which is on the back-surface side, are electrically connected to each other via the wiring line 30C and a through via 48C. In addition, the pad electrode 40B, which is on the front-surface side, and the external connection terminal 42B, which is on the back-surface side, are electrically connected to each other via the wiring line 30B and a through via 48B, the wiring line 30B having a longer wiring length than the wiring line 30C. In addition, the pad electrode 40A, which is on the front-surface side, and the external connection terminal 42A, which is on the back-surface side, are electrically connected to each other via the wiring line 30A and a through via 48A, the wiring line 30A having a longer wiring length than the wiring line 30B.

In such a case, for example, the structure illustrated in FIG. 5 may be applied to a connection terminal portion between the wiring line 30A and the pad electrode 40A. In addition, for example, the structure illustrated in FIG. 6 may be applied to a connection terminal portion between the wiring line 30B and the pad electrode 40B. In addition, for example, the structure illustrated in FIG. 7 may be applied to a connection terminal portion between the wiring line 30C and the pad electrode 40C. A structure described in the above-described embodiments may be applied to a connection portion between the through via 48A and the external connection terminal 42A, a connection portion between the through via 48B and the external connection terminal 42B, and a connection portion between the through via 48C and the external connection terminal 42C.

Figure 23:
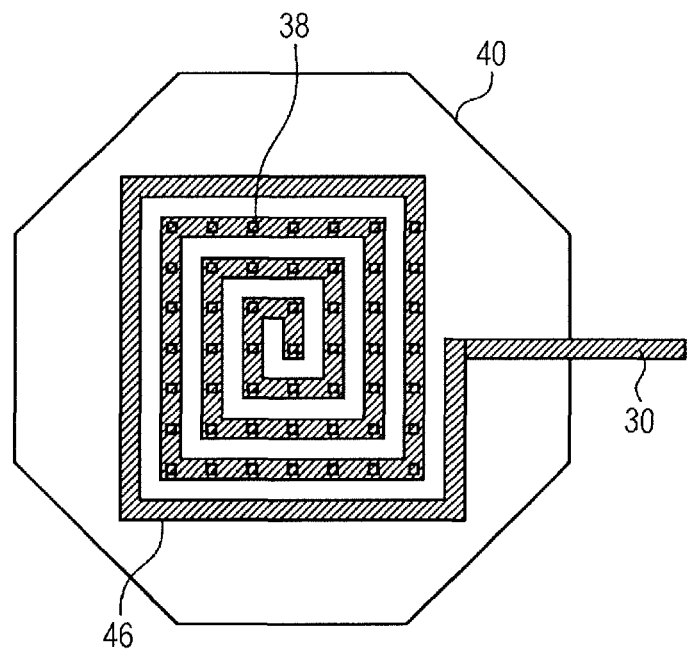
FIG. 23 is a plan view (part 1) illustrating the structure of a connection terminal portion of a wiring line in a wiring board according to a modified embodiment.
Figure 24:
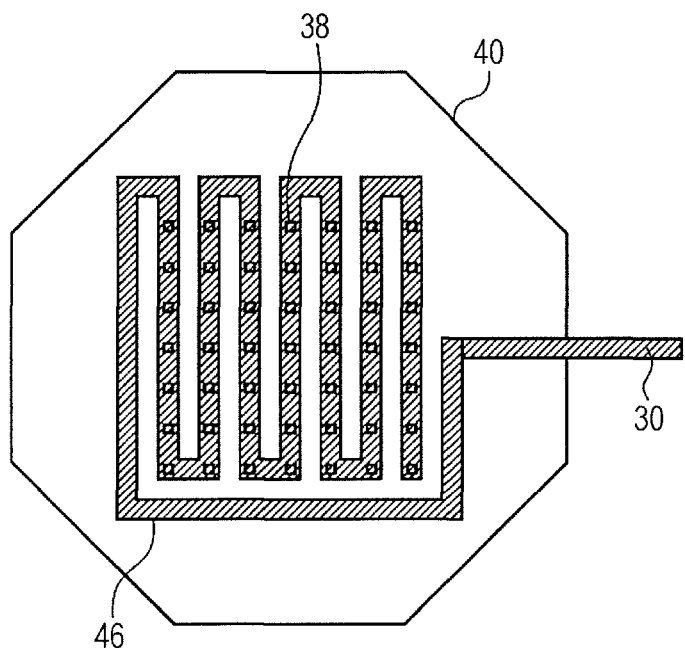
FIG. 24 is a plan view (part 2) illustrating the structure of a connection terminal portion of a wiring line in a wiring board according to a modified embodiment.

Moreover, a wiring pattern that forms a land 46 is not limited to a spiral shape or a meandering shape described in the above-described embodiments and may be changed or modified as appropriate. For example, as illustrated in FIGS. 23 and 24, an extension wiring portion that extends from a land 46 may be positioned in a center portion of a pad electrode 40.

In addition, a wiring length in a land may be made longer by forming wiring patterns of the land in a plurality of wiring layers and by connecting the wiring patterns in a layer thickness direction as appropriate.

In addition, in the above-described embodiments, examples in which processing to achieve equal wiring lengths is performed by changing only the arrangement of interlayer connection vias that connect a wiring line and a pad electrode are described; however, meander processing may further be performed for signal wiring lines. For example, from among a plurality of signal wiring lines belonging to a group for which processing to achieve equal wiring lengths is performed, meander processing may additionally be performed for a part of the plurality of signal wiring lines, the part of the plurality of signal wiring lines having a wiring length significantly shorter than the other wiring lines.

Note that meander processing is processing in which a wiring length is made longer by meandering a signal wiring line and differences in wiring length between the signal wiring line and the other signal wiring lines are reduced.

Moreover, the structure, constituent material, manufacturing conditions and the like of a wiring board described in the above-described embodiments are mere examples and those skilled in the art may make a change or a modification to them as appropriate in light of common general technical knowledge.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring board, comprising:
   a first wiring line formed on a substrate;
   a first land formed at a connection portion of the first wiring line and structured with a wiring pattern of a single wiring line;
   a second wiring line formed on the substrate and having a longer wiring length than the first wiring line;
   a second land formed at a connection portion of the second wiring line and structured with a wiring pattern having a substantially identical shape as the wiring pattern of the first land;
   a first pad electrode formed on the first land through an insulating film;

a second pad electrode formed on the second land through the insulating film having a substantially identical shape as the first pad electrode;

at least one first interlayer connection via embedded in the insulating film and electrically connecting a first portion of the first land to the first pad electrode; and at least one second interlayer connection via embedded in the insulating film and electrically connecting a second portion of the second land to the second pad electrode, wherein a wiring length of the wiring pattern of the first land between the connection portion of the first wiring line and the first portion is longer than the wiring length of the wiring pattern of the second land between the connection portion of the second wiring line and the second portion.

2. The wiring board according to claim 1, wherein the wiring length of the wiring pattern of the first land between the connection portion of the first wiring line and the first portion and the wiring length of the wiring pattern of the second land between the connection portion of the second wiring line and the second portion are defined such that a transmission time of a signal transmitting from the first wiring line to the first pad electrode approximates the transmission time of the signal transmitting from the second wiring line to the second pad electrode.

3. The wiring board according to claim 1, wherein number of the second interlayer connection via connecting the second land to the second pad electrode is greater than the number of the first interlayer connection via connecting the first land to the first pad electrode.

4. The wiring board according to claim 1, wherein the wiring patterns forming the first land and the second land have a spiral shape.

5. The wiring board according to claim 1, wherein the wiring patterns forming the first land and the second land have a meandering shape.

6. The wiring board according to claim 1, wherein the first interlayer connection via and the first pad electrode are respectively connected to both end portions of the first wiring line, and the second interlayer connection via and the second pad electrode are respectively connected to both end portions of the second wiring line of the second wiring line.

7. The wiring board according to claim 1, wherein the first wiring line and the second wiring line each have a through via penetrating the substrate.

8. A wiring board comprising:
a plurality of wiring lines formed on a substrate;
a plurality of lands that are formed at each connection portion of the plurality of wiring lines and structured respectively with a wiring pattern of a single wiring line having substantially identical shape;

a plurality of pad electrodes that are formed on each of the plurality of lands through an insulating film having substantially identical shape; and a plurality of interlayer connection vias embedded in the insulating film and electrically connecting a portion of each of the plurality of lands to each of the plurality of pad electrodes, wherein the interlayer connection vias are arranged such that, from among the plurality of wiring lines, the longer the wiring length of the wiring lines is, the shorter the wiring length of the wiring pattern between the connection portion of the wiring lines and the portion at where the interlayer connection vias is formed is.

9. A design method for a wiring board including a plurality of wiring lines formed on a substrate, a plurality of lands formed at each connection portion of the plurality of wiring lines and respectively structured with a wiring pattern of a single wiring line having substantially identical shape, a plurality of pad electrodes having substantially identical shape formed on each of the plurality of lands through an insulating film, and a plurality of interlayer connection vias embedded in the insulating film and electrically connecting a portion of each of the plurality of lands to the plurality of pad electrodes, the design method comprising:

determining positions of the plurality of pad electrodes;

arranging respectively the plurality of wiring lines connecting between the pad electrodes such that a wiring length of the wiring lines between connection terminal portions of the wiring lines is minimized;

extracting a group of wiring lines required to an equal length processing of the wiring lines from among the arranged plurality of wiring lines;

calculating a wiring length of a wiring line belonging to the group; and arranging the interlayer connection vias, based on the calculated wiring length of the wiring line, such that the longer the wiring length of the wiring line is, the shorter the wiring length of the wiring pattern between the connection portion of the wiring lines and the portion at where the interlayer connection via is formed is.

10. The design method according to claim 9, wherein the interlayer connection vias are arranged such that the longer the wiring length of the wiring lines is, the greater number of the interlayer connection vias connected to the lands is.

11. The design method according to claim 9, wherein the interlayer connection vias are arranged such that a signal delay time of a signal transmitting from the wiring lines to the pad electrodes through the lands and the interlayer connection vias approximates to the signal delay time between the wiring lines having a different wiring length.

\* \* \* \* \*